(12) United States Patent
Lee et al.

(10) Patent No.: US 10,952,319 B1
(45) Date of Patent: Mar. 16, 2021

(54) ELECTRONIC COMPONENT EMBEDDED SUBSTRATE

(71) Applicant: SAMSUNG ELECTRO-MECHANICS CO., LTD., Suwon-si (KR)

(72) Inventors: Young Kwan Lee, Suwon-si (KR); Kyoung Jun Kim, Suwon-si (KR); Yong Hoon Kim, Suwon-si (KR); Seung Eun Lee, Suwon-si (KR); Hak Chun Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/815,665

(22) Filed: Mar. 11, 2020

(30) Foreign Application Priority Data

Dec. 16, 2019 (KR) .......................... 10-2019-0167954

(51) Int. Cl.
| | | |
|---|---|---|
| *H05K 1/18* | (2006.01) | |
| *H05K 1/02* | (2006.01) | |
| *H05K 1/05* | (2006.01) | |
| *H05K 1/11* | (2006.01) | |
| *H01L 23/00* | (2006.01) | |

(52) U.S. Cl.
CPC .............. *H05K 1/05* (2013.01); *H01L 24/20* (2013.01); *H05K 1/023* (2013.01); *H05K 1/0204* (2013.01); *H05K 1/0212* (2013.01); *H05K 1/115* (2013.01); *H05K 1/183* (2013.01); *H05K 1/185* (2013.01)

(58) Field of Classification Search
CPC ........... H05K 1/183–185; H05K 1/0201–0212

USPC .................................................. 361/761, 763
See application file for complete search history.

(56) References Cited

U.S. PATENT DOCUMENTS

| | | | |
|---|---|---|---|
| 2002/0192442 A1 | 12/2002 | Kondo et al. | |
| 2003/0090883 A1* | 5/2003 | Asahi ................. | H01L 21/6835 361/761 |
| 2007/0085188 A1* | 4/2007 | Chang ................. | H01L 25/0652 257/686 |
| 2008/0000680 A1* | 1/2008 | Cho ....................... | H01L 24/82 174/262 |
| 2009/0188703 A1* | 7/2009 | Ito ....................... | H01L 23/5383 174/255 |
| 2009/0283299 A1 | 11/2009 | Suzuki | |
| 2010/0118502 A1* | 5/2010 | Inagaki ............... | H01L 21/4857 361/766 |

(Continued)

FOREIGN PATENT DOCUMENTS

| | | |
|---|---|---|
| JP | 2009-277784 A | 11/2009 |
| KR | 10-0488412 B1 | 5/2005 |

*Primary Examiner* — Hoa C Nguyen
(74) *Attorney, Agent, or Firm* — Morgan, Lewis & Bockius LLP

(57) ABSTRACT

An electronic component embedded substrate includes a core layer having a first cavity and a second cavity on a first surface and a second surface of the core layer, respectively, the second surface opposite to the first surface in a thickness direction of the core layer; an electronic component disposed in the first cavity; a first insulating material covering at least a portion of the electronic component; a first wiring layer disposed on the first insulating material and connected to the electronic component; a built-in block disposed in the second cavity; and a second insulating material covering at least a portion of the built-in block.

20 Claims, 9 Drawing Sheets

(56) References Cited

U.S. PATENT DOCUMENTS

| | | | |
|---|---|---|---|
| 2012/0043127 A1* | 2/2012 | Lin | H01L 24/19 174/266 |
| 2019/0103360 A1* | 4/2019 | Yu | H01L 23/5387 |
| 2019/0139853 A1* | 5/2019 | Oh | H01L 24/20 |

\* cited by examiner

1

ELECTRONIC COMPONENT EMBEDDED SUBSTRATE

CROSS-REFERENCE TO RELATED APPLICATION

The present application claims the benefit of priority to Korean Patent Application No. 10-2019-0167954 filed on Dec. 16, 2019 in the Korean Intellectual Property Office, the disclosure of which is incorporated herein by reference in its entirety.

BACKGROUND

1. Field

The present disclosure relates to an electronic component embedded substrate.

2. Description of Related Art

Recently, an electronic device has been required to have relatively high performance and relatively high functionality, as well as miniaturization and thinning of the electronic device. Accordingly, the number of electronic components to be mounted on a printed circuit board is increasing, but the number of electronic components capable of being mounted on a surface of the printed circuit board is limited. This is because a size of the printed circuit board is also required to be decreased, according to the miniaturization and thinning of the electronic device. Accordingly, a technology for electronic component embedded substrates embedding electronic components such as passive components and active components in the printed circuit board has been developed.

SUMMARY

An aspect of the present disclosure is to provide an electronic component embedded substrate having improved heat dissipation characteristics.

Another aspect of the present disclosure is to provide an electronic component embedded substrate having improved warpage.

According to an aspect of the present disclosure, an electronic component embedded substrate includes a core layer having a first cavity and a second cavity on a first surface and a second surface of the core layer, respectively, the second surface opposite to the first surface; an electronic component disposed in the first cavity; a first insulating material covering at least a portion of the electronic component; a first wiring layer disposed on the first insulating material and connected to the electronic component; a built-in block disposed in the second cavity; and a second insulating material covering at least a portion of the built-in block.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
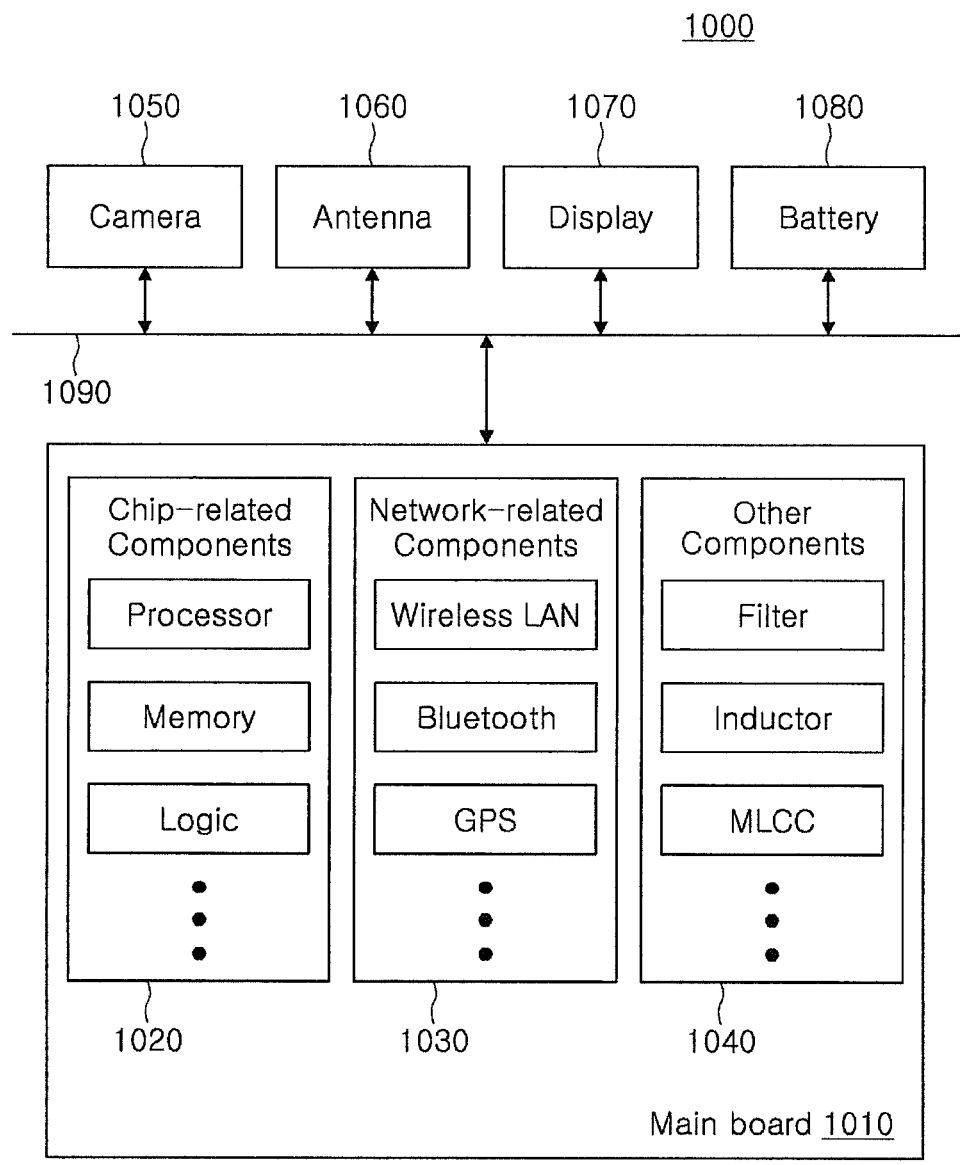
FIG. 1 is an example of a block diagram schematically illustrating an electronic device system according to an exemplary embodiment.

Hereinafter, the present disclosure will be described with reference to the accompanying drawings. Shapes and sizes of the elements in the drawings may be exaggerated or reduced for clarity of description.

Electronic Device

FIG. 1 is an example of a block diagram schematically illustrating an electronic device system according to an exemplary embodiment.

Referring to the drawings, an electronic device 1000 may accommodate a main board 1010 therein. The main board 1010 may include chip related components 1020, network related components 1030, other components 1040, and the like, physically and/or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like. However, the chip related components 1020 are not limited thereto, and may also include other types of chip related components. In addition, the chip related components 1020 may be combined with each other. The chip related component 1020 may be in the form of a package including the above-described chip or an electronic component.

The network related components 1030 may include protocols such as wireless fidelity (Wi-Fi) (Institute of Electrical and Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 and/or the network related components 1030 described above.

Depending on a type of the electronic device 1000, the electronic device 1000 may include other components that may or may not be physically and/or electrically connected to the main board 1010. These other components may include, for example, a camera module 1050, an antenna module 1060, a display device 1070, a battery 1080, or the like. However, these other components are not limited thereto, but may also include an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. These other components may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
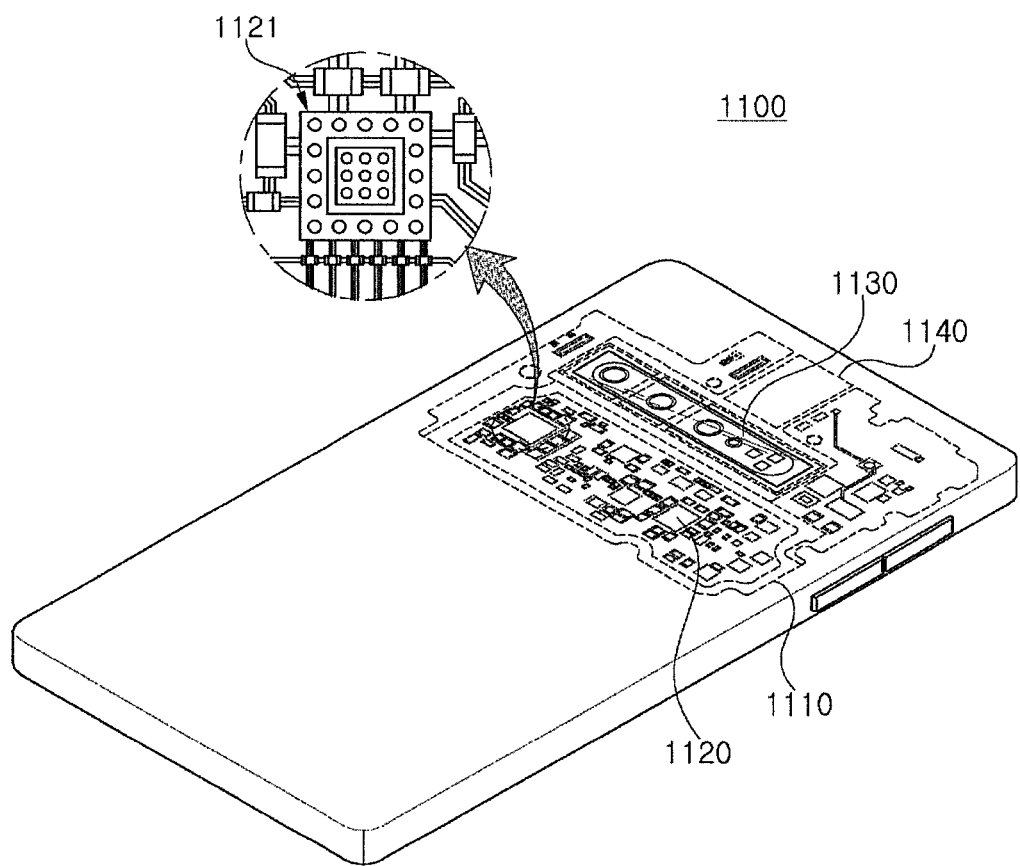
FIG. 2 is a perspective view schematically illustrating an electronic device according to an exemplary embodiment.

FIG. 2 is a perspective view schematically illustrating an electronic device according to an exemplary embodiment.

Referring to the drawings, an electronic device may be, for example, a smartphone 1100. A main board 1110 may be accommodated in the smartphone 1100, and various electronic components 1120 may be physically and/or electrically connected to the main board 1110. In addition, other electronic components, such as a camera module 1130 and/or a speaker 1140, which may or may not be physically and/or electrically connected to the main board 1110 may be accommodated therein. A portion of the electronic components 1120 may be the above-described chip related components, for example, a semiconductor package 1121, but are not limited thereto. The semiconductor package 1121 may be a surface in which a semiconductor chip or a passive component is mounted on a package substrate in a package substrate form, but is not limited thereto. The electronic device is not necessarily limited to the smartphone 1100, but may be other electronic devices as described above.

Electronic Component Embedded Substrate

Figure 3:
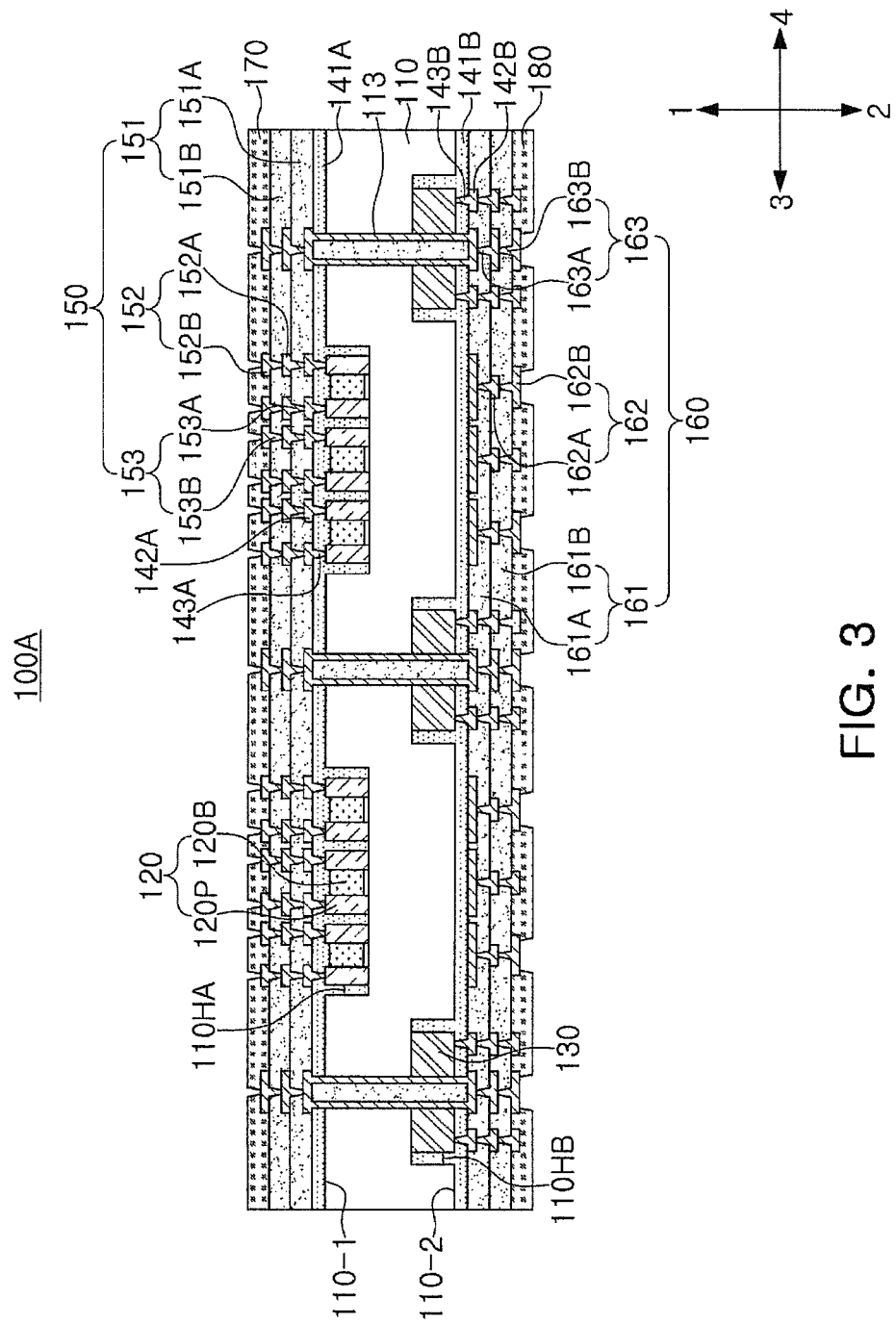
FIG. 3 is a cross-sectional view schematically illustrating an electronic component embedded substrate 100A according to an exemplary embodiment.

FIG. 3 is a cross-sectional view schematically illustrating an electronic component embedded substrate 100A according to an exemplary embodiment.

Referring to FIG. 3, an electronic component embedded substrate 100A according to an exemplary embodiment may include a core layer 110 having a first cavity 110HA and a second cavity 110HB, respectively at a first surface 110-1 and a second surface 110-2; an electronic component 120 disposed in the first cavity 110HA; a first insulating material 141A covering at least a portion of the electronic component 120; a first wiring layer 142A disposed on the first insulating material 141A; a first via 143A penetrating through the first insulating material 141A and connecting the electronic component 120 and the first wiring layer 142A; a built-in block 130 disposed in the second cavity 110HB; a second insulating material 141B covering at least a portion of the built-in block 130; a second wiring layer 142B disposed on the second insulating material 141B; a second via 143B penetrating through the second insulating material 141B and connecting the built-in block 130 and the second wiring layer 142B; a through-via 113 penetrating through the first insulating material 141A, the core layer 110, the built-in block 130, and the second insulating material 141B, and connecting the first wiring layer 142A and the second wiring layer 142B to each other; a first build-up structure 150 disposed on the first insulating material 141A; a second build-up structure 160 disposed on the second insulating material 141B; a first passivation layer 170 disposed on the first build-up structure 150; and a second passivation layer 180 disposed on the second build-up structure 160. As necessary, an electrical connection metal (not illustrated) disposed in an opening of each of the first passivation layer 170 and the second passivation layer 180 may be further included.

The first cavity 110HA may penetrate through a portion of the core layer 110 in a thickness direction of the core layer 110 from the first surface 110-1 of the core layer 110. Similarly, the second cavity 110HB may penetrate through a portion of the core layer 110 in the thickness direction of the core layer 110 from the second surface 110-2 of the core layer 110. In this case, the thickness direction refers to a first direction 1 and/or a second direction 2. Therefore, the thickness direction may be a direction, parallel to a direction connecting the first surface 110-1 and the second surface 110-2 of the core layer 110.

Each of the first cavity 110HA and the second cavity 110HB may penetrate through less than one half of a thickness of the core layer 110. For example, each of the first cavity 110HA and the second cavity 110HB may penetrate through about one third of the thickness of the core layer 110. Therefore, in a cross-sectional view, the first cavity 110HA and the second cavity 110HB may not have overlapping regions.

As such, when the first cavity 110HA passes through the core layer 110 shallowly, it may be advantageous to shorten an electrical connection path with a semiconductor package (not illustrated) mounted on the electronic component embedded substrate. A thickness of the second cavity 110HB may be substantially the same as a thickness of the first cavity 110HA. However, the present disclosure is not limited thereto, and the thickness of the second cavity 110HB may be different from the thickness of the first cavity 110HA.

The term "substantially the same" in the present specification does not mean exactly the same without an error, but includes a tolerance range having a degree that may be recognized by those skilled in the art.

As illustrated in the drawings, each of the first cavity 110HA and the second cavity 110HB may be provided as a plurality of first cavities 110HA and a plurality of second cavities 110HB. Although the drawings illustrate that two first cavities 110HA and three second cavities 110HB are formed, the present disclosure is not limited thereto. The number of first cavities 110HA and second cavities 110HB may be changed, depending on a design.

Each of the electronic component 120 and the built-in block 130 may also be provided in plural. In this case, the one or more electronic components 120 may be disposed in each of the plurality of first cavities 110HA. In addition, the one or more built-in blocks 130 may be disposed in each of the plurality of second cavities 110HB. The number of electronic components 120 disposed in each of the plurality of first cavities 110HA may be greater than the number of built-in blocks 130 disposed in each of the plurality of second cavities 110HB.

When the electronic component 120 is provided as the plurality of electronic components 120, the one or more electronic components 120 may be disposed in the first cavity 110HA. In addition, when the first cavity 110HA is provided as the plurality of first cavities 110HA, the one or more electronic components 120 may be disposed in each of the plurality of first cavities 110HA.

When the built-in block 130 is provided as the plurality of built-in blocks 130, the one or more built-in blocks 130 may be disposed in the second cavity 110HB. In addition, when the second cavity 110HB is provided as the the plurality of second cavities 110HB, the one or more built-in blocks 130 may be disposed in each of the plurality of second cavities 110HB.

The electronic component 120 and the built-in block 130 may be arranged to deviate from each other on a plane. A plane could be perpendicular to the first direction 1 and the second direction 2 and parallel to the third direction 3 and the fourth direction 4. Therefore, a straight line connecting a center of the electronic component 120 and a center of the built-in block 130 may intersect a straight line connecting the first and second surfaces of the core layer.

The first cavity 110HA and the second cavity 110HB may also be formed to deviate from each other on a plane. A portion of each of the first cavity 110HA and the second cavity 110HB may be formed to partially overlap each other on the plane.

As described above, each of the first cavity 110HA and the second cavity 110HB may be provided as the plurality of first cavities 110HA and the plurality of second cavities 110HB. In this case, each of the plurality of first cavities 110HA and each of the second cavities 110HB in the cross-sectional view may be formed to be alternately disposed on the first or second surfaces 110-1 and 110-2 in a third or fourth direction. Therefore, in the cross-sectional view, a line connecting the centers of each of the plurality of first cavities 110HA and each of the second cavities 110HB in the third or fourth direction in sequence may have a V shape, a W shape, an inverted V shape, an inverted W shape, a zigzag shape, or the like.

Similarly, the electronic component 120 disposed in each of the plurality of first cavities 110HA and the built-in block 130 disposed in each of the plurality of second cavities 110HB in the cross-sectional view may be also formed to be alternately disposed on the first or second surfaces 110-1 and 110-2 in the third or fourth direction. The furnace may be formed on the first surface 110-1 and the second surface 110-2. Therefore, in the cross-sectional view, a line connecting the center of the electronic component 120 disposed in each of the plurality of first cavities 110HA and the center of the built-in block 130 disposed in each of the plurality of second cavities 110HB in the third or fourth direction in sequence may have a V shape, a W shape, and an inverted V shape, an inverted W shape, a zigzag shape, or the like.

Recently, in a case of an electronic component embedded substrate, in order to shorten an electrical connection path with a semiconductor package (not illustrated) mounted on the electronic component embedded substrate, an electronic component may be embedded on one side of the electronic component embedded substrate. In this case, since the electronic components are disposed to be adjacent to one side of the electronic component embedded substrate, structural stability may be deteriorated due to asymmetry of the entire substrate. Therefore, warpage of the electronic component embedded substrate may occur.

In a case of an electronic component embedded substrate 100A according to an exemplary embodiment, the electronic component 120 may be disposed to be adjacent to the first surface 110-1 of the core layer 110. The built-in block 130 may be disposed on the second surface 110-2 of the core layer 110, opposite to the first surface 110-1, to improve the asymmetry. Therefore, the warpage of the electronic component embedded substrate 100A may be improved. The built-in block 130 may be disposed in consideration of factors influencing the warpage of the electronic component embedded substrate 100A, such as thermal expansion coefficient, volume, weight, and the like of each of the electronic component 120 and the built-in block 130.

The through-via 113 may penetrate through the core layer 110 and may further penetrate through the built-in block 130. Therefore, the through-via 113 may be in contact with at least a portion of the built-in block 130.

As described below, the built-in block 130 may include a thermally conductive material. In this case, heat generated from the semiconductor package (not illustrated) mounted on the electronic component embedded substrate 100A may not only be discharged through the through-via 113, but also be discharged through the built-in block 130 connected to the through-via 113. Therefore, heat dissipation characteristics of the electronic component embedded substrate 100A may be improved.

In this case, on the second surface 110-2 of the core layer 110, the second via 143B may be disposed around the through-via 113. Therefore, the heat transferred through the through-via 113 and the built-in block 130 may be discharged through the second via 143B.

Hereinafter, each configuration of an electronic component embedded substrate 100A according to an exemplary embodiment will be described in more detail.

The core layer 110 may serve to reduce rigidity of the substrate to suppress the warpage of the substrate, and the like. A material for forming the core layer 110 is not particularly limited, and any material may be used, as long as it has insulating properties. For example, a thermosetting resin such as an epoxy resin, a thermoplastic resin such as polyimide, or materials including reinforcing materials such as inorganic fillers, and/or glass cloth, glass fabric, or the like, together therewith, such as prepreg, Ajinomoto Build-up Film (ABF), FR-4, bismaleimide triazine (BT), and the like may be used. As necessary, a photoimageable dielectric (PID) resin may be used.

The electronic component 120 and the built-in block 130 may be disposed in each of the first cavity 110HA and the second cavity 110HB. The thickness of each of the first cavity 110HA and the second cavity 110HB may be the same as or different from each other.

The through-via 113 may penetrate through the core layer 110 and the built-in block 130, and may connect the first wiring layer 142A and the second wiring layer 142B to each other. The through-via 113 may also penetrate through the first insulating material 141A and the second insulating material 141B as illustrated in the drawings.

As a material for forming the through-via 113, a conductive material such as copper (Cu), aluminum (Al), silver (Ag), tin (Sn), gold (Au), nickel (Ni), lead (Pb), titanium (Ti), alloys thereof, or the like may be used. The through-via 113 may be entirely filled with a conductive material, or the conductive material may be formed along a wall of the via. When the through-via 113 is those in which a conductive material is formed along a wall of a via hole, an insulating material may fill the via hole. In addition, a shape of the through-via 113 may be applied to all shapes known in the art, such as a tapered shape, a cylindrical shape, or the like.

The electronic component 120 may be a passive component such as a capacitor, an inductor, or the like, and may be a passive component of a chip type including a body 120B and an electrode 120P. For example, the electronic component 120 may be a multilayer ceramic capacitor (MLCC). However, the present disclosure is not limited thereto, and the electronic component 120 may be an active component such as an integrated circuit (IC), a semiconductor chip, or the like. As described above, the electronic component 120 may be provided as the plurality of electronic components 120. In this case, each of the electronic components 120 may be the same as or different from each other. For example, a portion of the plurality of electronic components 120 may be capacitors, and a portion of the plurality of electronic components 120 may be inductors.

The built-in block 130 may be disposed on a side, opposite to a side on which the electronic component 120 of the substrate is disposed, and may serve to improve warpage of the substrate. In this case, the material for forming the built-in block 130 is not particularly limited.

The built-in block 130 may be in the form of a lump, and a shape of the built-in block 130 is not particularly limited. For example, the shape of the built-in block 130 may be a rectangular shape, a regular hexahedron, a triangular column, a pentagonal column, a hexagonal column, or the like.

A material of the built-in block 130 may include a thermally conductive material capable of transferring heat. For example, copper (Cu), graphene, aluminum (Al), silver (Ag), gold (Au), nickel (Ni), lead (Pb), titanium (Ti), alloys thereof, or the like may be used. For example, the built-in block 130 may be a copper block. As such, when the built-in block 130 includes the thermally conductive material, the built-in block 130 may serve as heat release paths of heat transferred to the electronic component embedded substrate 100A and heat generated from the electronic component embedded substrate 100A, and the like.

However, the present disclosure is not limited thereto, and an insulating material may be used as the material of the built-in block 130. For example, a thermosetting resin such as an epoxy resin, or a resin in which a reinforcement such as an inorganic filler, and/or glass cloth, glass fabric, or the like is further included in the thermosetting resin may be used.

The first insulating material 141A may cover at least a portion of the electronic component 120 to perform physical and chemical protection. For example, the first insulating material 141A may cover at least a portion of each a side surface of the electronic component 120 and a surface of the electronic component 120 facing the first build-up structure 150, and may fill at least a portion of the first cavity 110HA. When there are a plurality of electronic components 120 disposed in the first cavity 110HA, a space between each of the electronic components 120 may be filled. In addition, at least a portion of the first surface 110-1 of the core layer 100 may be covered.

A material for forming the first insulating material 141A is not particularly limited, and any material may be used, as long as it has insulating properties. For example, a thermosetting resin such as an epoxy resin, a thermoplastic resin such as polyimide, or materials including reinforcing materials such as inorganic fillers, and/or glass cloth, glass fabric, or the like, together therewith, such as prepreg, Ajinomoto Build-up Film (ABF), FR-4, bismaleimide triazine (BT), and the like may be used. As necessary, a photoimageable dielectric (PID) resin may be used.

The first wiring layer 142A may be connected to the electronic component 120 and/or the through-via 113. As a material for forming the first wiring layer 142A, a conductive material such as copper (Cu), aluminum (Al), silver (Ag), tin (Sn), gold (Au), nickel (Ni), lead (Pb), titanium (Ti), alloys thereof, or the like may be used. The first wiring layer 142A may perform various functions, depending on a design thereof. For example, a ground (GND) pattern, a power (PWR) pattern, a signal (S) pattern, and the like may be included. In this case, the signal (S) pattern may include various signals except for the ground (GND) pattern, the power (PWR) pattern, and the like, for example, a data signal, and the like. In addition, a via pad or the like may be included.

The first via 143A may connect the electronic component 120 and the first wiring layer 142A. As a material for forming the first via 143A, a conductive material such as copper (Cu), aluminum (Al), silver (Ag), tin (Sn), gold (Au), nickel (Ni), lead (Pb), titanium (Ti), alloys thereof, or the like may be used. The first via 143A may be entirely filled with a conductive material, or the conductive material may be formed along a wall of the first via 143A. In addition, a shape of the first via 143A may be applied to all shapes known in the art, such as a tapered shape, a cylindrical shape, or the like.

The second insulating material 141B may cover at least a portion of the built-in block 130 to perform physical and chemical protection. For example, the second insulating material 141B may cover at least a portion of each a side surface of the built-in block 130 and a surface of the built-in block 130 facing the second build-up structure 160, and may fill at least a portion of the second cavity 110HB. In addition, at least a portion of the second surface 110-2 of the core layer 100 may be covered.

A material for forming the second insulating material 141B is not particularly limited, and any material may be used, as long as it has insulating properties. For example, a thermosetting resin such as an epoxy resin, a thermoplastic resin such as polyimide, or materials including reinforcing materials such as inorganic fillers, and/or glass cloth, glass fabric, or the like, together therewith, such as prepreg, Ajinomoto Build-up Film (ABF), FR-4, bismaleimide triazine (BT), and the like may be used. As necessary, a photoimageable dielectric (PID) resin may be used.

The second wiring layer 142B may be connected to the built-in block 130 and/or the through-via 113. As a material for forming the second wiring layer 142B, a conductive material such as copper (Cu), aluminum (Al), silver (Ag), tin (Sn), gold (Au), nickel (Ni), lead (Pb), titanium (Ti), alloys thereof, or the like may be used. The second wiring layer 142B may perform various functions, depending on a design thereof. For example, a ground (GND) pattern, a power (PWR) pattern, a signal (S) pattern, and the like may be included. In this case, the signal (S) pattern may include various signals except for the ground (GND) pattern, the power (PWR) pattern, and the like, for example, a data signal, and the like. In addition, a via pad or the like may be included.

The second via 143B may connect the built-in block 130 and the second wiring layer 142B. As material for forming the second via 143B, a conductive material such as copper (Cu), aluminum (Al), silver (Ag), tin (Sn), gold (Au), nickel (Ni), lead (Pb), titanium (Ti), alloys thereof, or the like may be used. The second via 143B may be entirely filled with a conductive material, or the conductive material may be formed along a wall of the second via 143B. In addition, a shape of the second via 143B may be applied to all shapes known in the art, such as a tapered shape, a cylindrical shape, or the like.

The first build-up structure 150 may include a first insulating layer 151A disposed on the first insulating material 141A and covering the first wiring layer 142A; a third wiring layer 152A disposed on the first insulating layer 151A; a third via 153A penetrating through the first insulating layer 151A and connecting the first wiring layer 142A and the third wiring layer 152A; a second insulating layer 151B disposed on the first insulating layer 151A and covering the third wiring layer 152A; a fourth wiring layer 152B disposed on the second insulating layer 151B; and a fourth via 153B penetrating through the second insulating layer 151B and connecting the third wiring layer 152A and the fourth wiring layer 152B.

The structure of the first build-up structure 150 is not limited thereto, and may be changed within a range capable of being designed by those skilled in the art. For example, the number of insulating layers, wiring layers, and/or vias included in the first build-up structure 150 may be more or less than that illustrated in the drawings.

A material for forming each of the first insulating layer 151A and the second insulating layer 151B is not particularly limited, and any material may be used, as long as it has insulating properties. For example, a thermosetting resin such as an epoxy resin, a thermoplastic resin such as polyimide, or materials including reinforcing materials such as inorganic fillers, and/or glass cloth, glass fabric, or the like, together therewith, such as prepreg, Ajinomoto Build-up Film (ABF), FR-4, bismaleimide triazine (BT), and the like may be used. As necessary, a photoimageable dielectric (PID) resin may be used.

A boundary between the first insulating layer 151A and the second insulating layer 151B may not be distinguished from each other, depending on materials and processes of the first and second insulating layers 151A and 151B. For example, the first insulating layer 151A and the second insulating layer 151B may be integrated with each other, or the boundary therebetween may be unclear during a stacking process. Therefore, it may be difficult to visually determine the boundary of the electronic component embedded substrate, finally produced.

In addition, the boundary between the first insulating layer 151A and the first insulating material 141A, contacting the same, may also not be distinguishable from each other, depending on materials and processes of the first insulating layer 151A and the first insulating material 141A. For example, during the lamination process, the first insulating layer 151A and the first insulating material 141A may be integrated with each other, or the boundary therebetween may be unclear during a stacking process. Therefore, it may be difficult to visually determine the boundary of the electronic component embedded substrate, finally produced.

As a material for forming each of the third wiring layer 152A and the fourth wiring layer 152B, a conductive material such as copper (Cu), aluminum (Al), silver (Ag), tin (Sn), gold (Au), nickel (Ni), lead (Pb), titanium (Ti), alloys thereof, or the like may be used. Each of the third wiring layer 152A and the fourth wiring layer 152B may perform various functions, depending on a design thereof. For example, a ground (GND) pattern, a power (PWR) pattern, a signal (S) pattern, and the like may be included. In this case, the signal (S) pattern may include various signals except for the ground (GND) pattern, the power (PWR) pattern, and the like, for example, a data signal, and the like. In addition, a via pad or the like may be included.

As a material for forming each of the third via 153A and the fourth via 153B, a conductive material such as copper (Cu), aluminum (Al), silver (Ag), tin (Sn), gold (Au), nickel (Ni), lead (Pb), titanium (Ti), alloys thereof, or the like may be used. Each of the third via 153A and the fourth via 153B may be entirely filled with a conductive material, or the conductive material may be formed along a wall of the via. When the via is that in which a conductive material is formed along a wall of a via hole, an insulating material may fill the via hole. In addition, a shape of each of the third via 153A and the fourth via 153B may be any shape known in the art, such as a tapered shape, a cylindrical shape, or the like.

The second build-up structure 160 may include a third insulating layer 161A disposed on the second insulating material 141B and covering the second wiring layer 142B; a fifth wiring layer 162A disposed on the third insulating layer 161A; a fifth via 163A penetrating through the third insulating layer 161A and connecting the first wiring layer 142A and the fifth wiring layer 162A; a fourth insulating layer 161B disposed on the third insulating layer 161A and covering the fifth wiring layer 162A; a sixth wiring layer 162B disposed on the fourth insulating layer 161B; and a sixth via 163B penetrating through the fourth insulating layer 161B and connecting the fifth wiring layer 162A and the sixth wiring layer 162B.

The structure of the second build-up structure 160 is not limited thereto, and may be changed within a range capable of being designed by those skilled in the art. For example, the number of insulating layers, wiring layers, and/or vias included in the second build-up structure 160 may be more or less than that illustrated in the drawings.

A material for forming each of the third insulating layer 161A and the fourth insulating layer 161B is not particularly limited, and any material may be used, as long as it has insulating properties. For example, a thermosetting resin such as an epoxy resin, a thermoplastic resin such as polyimide, or materials including reinforcing materials such as inorganic fillers, and/or glass cloth, glass fabric, or the like, together therewith, such as prepreg, Ajinomoto Build-up Film (ABF), FR-4, bismaleimide triazine (BT), and the like may be used. As necessary, a photoimageable dielectric (PID) resin may be used.

A boundary between the third insulating layer 161A and the fourth insulating layer 161B may not be distinguished from each other, depending on materials and processes of the third and fourth insulating layers 161A and 161B. For example, the third insulating layer 161A and the fourth insulating layer 161B may be integrated with each other, or the boundary therebetween may be unclear during a stacking process. Therefore, it may be difficult to visually determine the boundary of the electronic component embedded substrate, finally produced.

In addition, the boundary between the third insulating layer 161A and the second insulating material 141B, contacting the same, may also not be distinguishable from each other, depending on materials and processes of the third insulating layer 161A and the second insulating material 141B. For example, during the lamination process, the third insulating layer 161A and the second insulating material 141B may be integrated with each other, or the boundary therebetween may be unclear during a stacking process.

Therefore, it may be difficult to visually determine the boundary of the electronic component embedded substrate, finally produced.

As a material for forming each of the fifth wiring layer 162A and the sixth wiring layer 162B, a conductive material such as copper (Cu), aluminum (Al), silver (Ag), tin (Sn), gold (Au), nickel (Ni), lead (Pb), titanium (Ti), alloys thereof, or the like may be used. Each of the fifth wiring layer 162A and the sixth wiring layer 162B may perform various functions, depending on a design thereof. For example, a ground (GND) pattern, a power (PWR) pattern, a signal (S) pattern, and the like may be included. In this case, the signal (S) pattern may include various signals except for the ground (GND) pattern, the power (PWR) pattern, and the like, for example, a data signal, and the like. In addition, a via pad or the like may be included.

As a material for forming each of the fifth via 163A and the sixth via 163B, a conductive material such as copper (Cu), aluminum (Al), silver (Ag), tin (Sn), gold (Au), nickel (Ni), lead (Pb), titanium (Ti), alloys thereof, or the like may be used. Each of the third via 153A and the fourth via 153B may be entirely filled with a conductive material, or the conductive material may be formed along a wall of the via. When the via is that in which a conductive material is formed along a wall of a via hole, an insulating material may fill the via hole. In addition, a shape of each of the fifth via 163A and the sixth via 163B may be any shape known in the art, such as a tapered shape, a cylindrical shape, or the like.

The first passivation layer 170 and the second passivation layer 180 may protect an internal structure of the electronic component embedded substrate 100A from physical or chemical damage, or the like externally. Each of the first passivation layer 170 and the second passivation layer 180 may include a thermosetting resin and an inorganic filler. For example, each of the first passivation layer 170 and the second passivation layer 180 may be ABF. The present disclosure is not limited thereto, and the first passivation layer 170 and the second passivation layer 180 may be a known photosensitive insulating layer, for example, a solder resist (SR) layer.

The first passivation layer 170 and the second passivation layer 180 may include the same kind of material, and may have substantially the same thickness as each other. However, the present disclosure is not limited thereto, and may include different kinds of materials, and may have different thicknesses from each other.

The first passivation layer 170 may have one or more openings (not illustrated) that expose at least a portion of the fourth wiring layer 152B of the first build-up structure 150. In addition, the second passivation layer 180 may have one or more openings (not illustrated) that expose at least a portion of the sixth wiring layer 162B of the second build-up structure 160. In these cases, a surface treatment layer may be formed on each of the exposed wiring layers 152B and 162B. The surface treatment layer may be formed by, for example, a gold plating process, a tin plating process, a silver plating process, a nickel plating process, or the like. As necessary, the openings of each of the first passivation layer 170 and the second passivation layer 180 may be formed of a plurality of via holes.

FIGS. 4A to 4D schematically illustrate a manufacturing process of an electronic component embedded substrate 100A according to an exemplary embodiment.

Figure 4A:
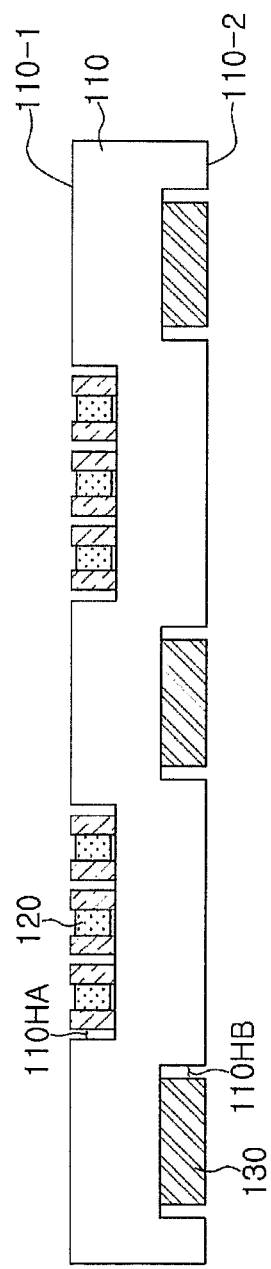
FIGS. 4A to 4D schematically illustrate a manufacturing process of an electronic component embedded substrate 100A according to an exemplary embodiment.

Referring to FIG. 4A, first, a first cavity 110HA and a second cavity 110HB may be formed on first and second surfaces 110-1 and 110-2 of a core layer 110, respectively.

An electronic component 120 and a built-in block 130 may be disposed in each of the first cavity 110HA and the second cavity 110HB.

In this case, each of the electronic component 120 and the built-in block 130 may be disposed to be attached to the core layer 110 by an adhesive member (not illustrated), for fixing the electronic component 120 and the built-in block 130, respectively.

When the electronic component 120 disposed in the first cavity 110HA is provides as a plurality of electronic components 120, each of the plurality of electronic components 120 in the first cavity 110HA may be disposed to be spaced apart from each other by a predetermined distance.

Each of the first cavity 110HA and the second cavity 110HB may be formed by a sandblasting process using abrasive particles, a dry etching process using plasma, a mechanical drill, a laser drill, and/or the like. When each of the first cavity 110HA and the second cavity 110HB is formed using the mechanical drill and/or the laser drill, a desmearing treatment process such as a permanganate process or the like may be performed to remove a resin smear in each of the first cavity 110HA and the second cavity 110HB.

Figure 4B:
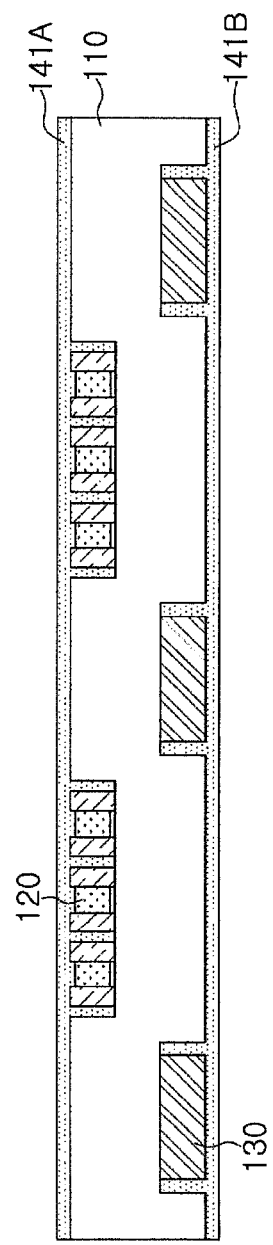

Next, referring to FIG. 4B, a first insulating material 141A and a second insulating material 141B may be formed, respectively.

The first insulating material 141A may be formed to cover at least portion of each of a side surface of the electronic component 120, an outermost surface of the electronic component 120 in the third direction, and the first surface 110-1 of the core layer 100, and may be formed to fill at least a portion of the first cavity 110HA. When the electronic component 120 disposed in the first cavity 110HA is provided, in plural, the first insulating material 141A may be formed to fill a space between each of the plurality of electronic components 120.

The second insulating material 141B may be formed to cover at least portion of each of a side surface of the built-in block 130, an outermost surface of the built-in block 130 in the fourth direction, and the second surface 110-2 of the core layer 100, and may be formed to fill at least a portion of the second cavity 110HB.

Each of the first insulating material 141A and the second insulating material 141B may be formed by a known method. For example, each of the first insulating material 141A and the second insulating material 141B may be formed by a process including laminating precursors thereof by a known lamination process, and then curing the laminated precursors, may be formed by a process including applying precursors thereof, and then curing the applied precursors, or may be formed by other processes.

Figure 4C:
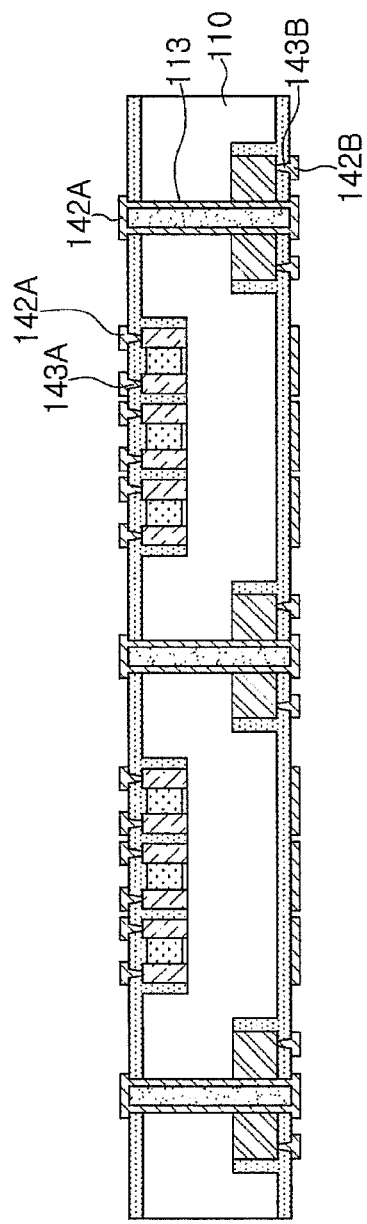

Next, referring to FIG. 4C, a first via 143A and a second via 143B penetrating through the first insulating material 141A and the second insulating material 141B, respectively, may be formed. In addition, a through-via 113 penetrating through the first insulating material 141A, the core layer 110, the built-in block 130, and the second insulating material 141B may be formed. In addition, a first wiring layer 142A and a second wiring layer 142B may be formed on each of the first insulating material 141A and the second insulating material 141B.

Each of these structures may be formed by a known process. For example, these structures may be formed by forming a through-via hole or a via hole using a photolithography process, a mechanical drill, a laser drill, and/or the like, patterning the same with a dry film or the like, and then filling the via holes and the patterned space with a plating process or the like.

Figure 4D:
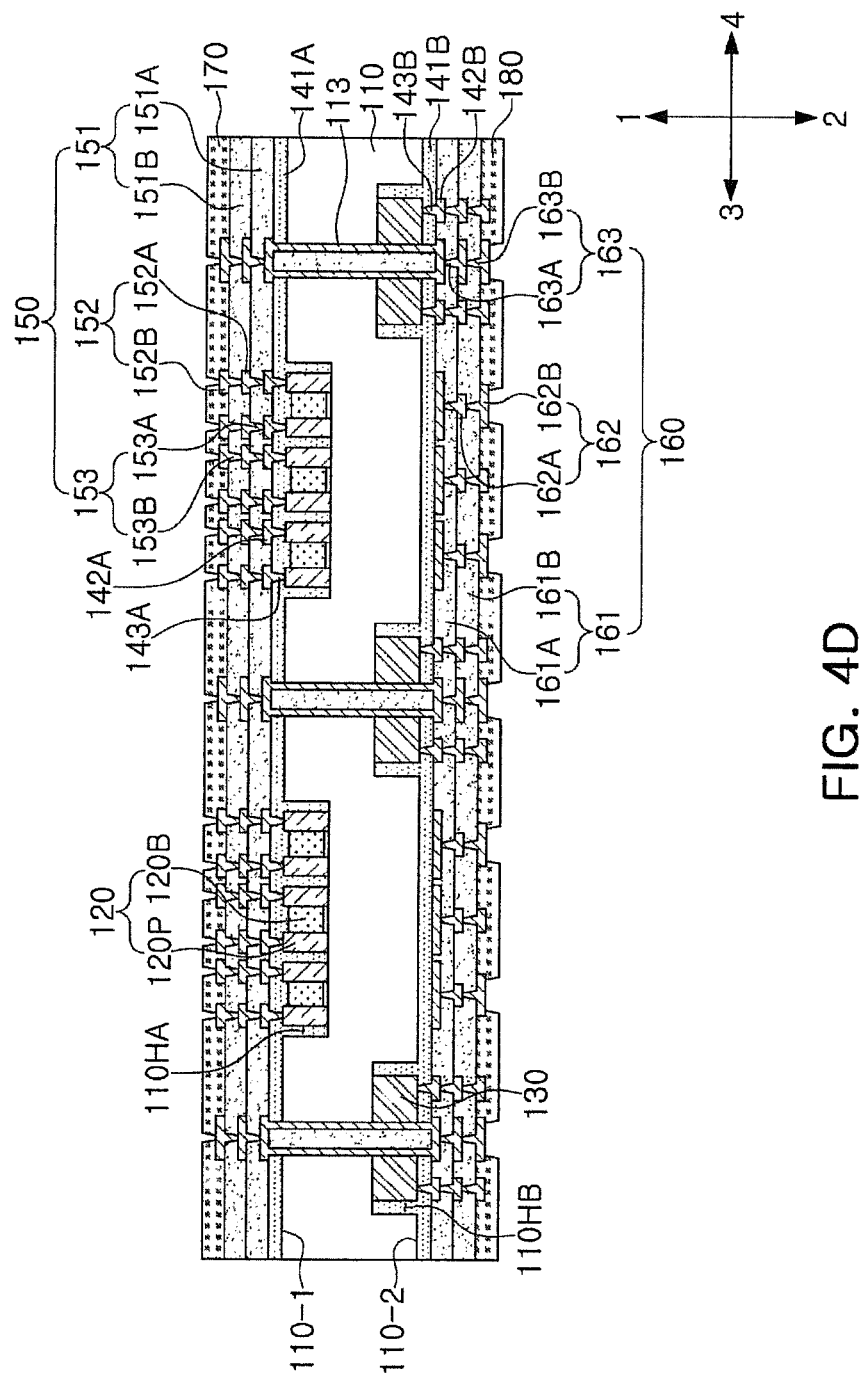

Next, referring to FIG. 4D, a first build-up structure 150 and a second build-up structure 160 may be formed on the first insulating material 141A and the second insulating material 141B, respectively. Procedures used in this process may be the same as described in FIGS. 4B to 4C.

In addition, a first passivation layer 170 and a second passivation layer 180 may be formed on each of the first build-up structure 150 and the second build-up structure 160, as necessary. Each of the first passivation layer 170 and the second passivation layer 180 may also be formed by a known process, for example, by a process including laminating precursors of each of the first passivation layer 170 and the second passivation layer 180, and then curing the laminated precursors, may be formed by a process including applying materials for forming each of the first passivation layer 170 and the second passivation layer 180, and then curing the applied materials, or may be formed by other processes.

A manufacturing process of an electronic component embedded substrate 100A according to an exemplary embodiment is not limited to the above-described process, and may be carried out by a person skilled in the art. For example, an order of manufacturing each component may be changed, deleted, and/or added.

Figure 5:
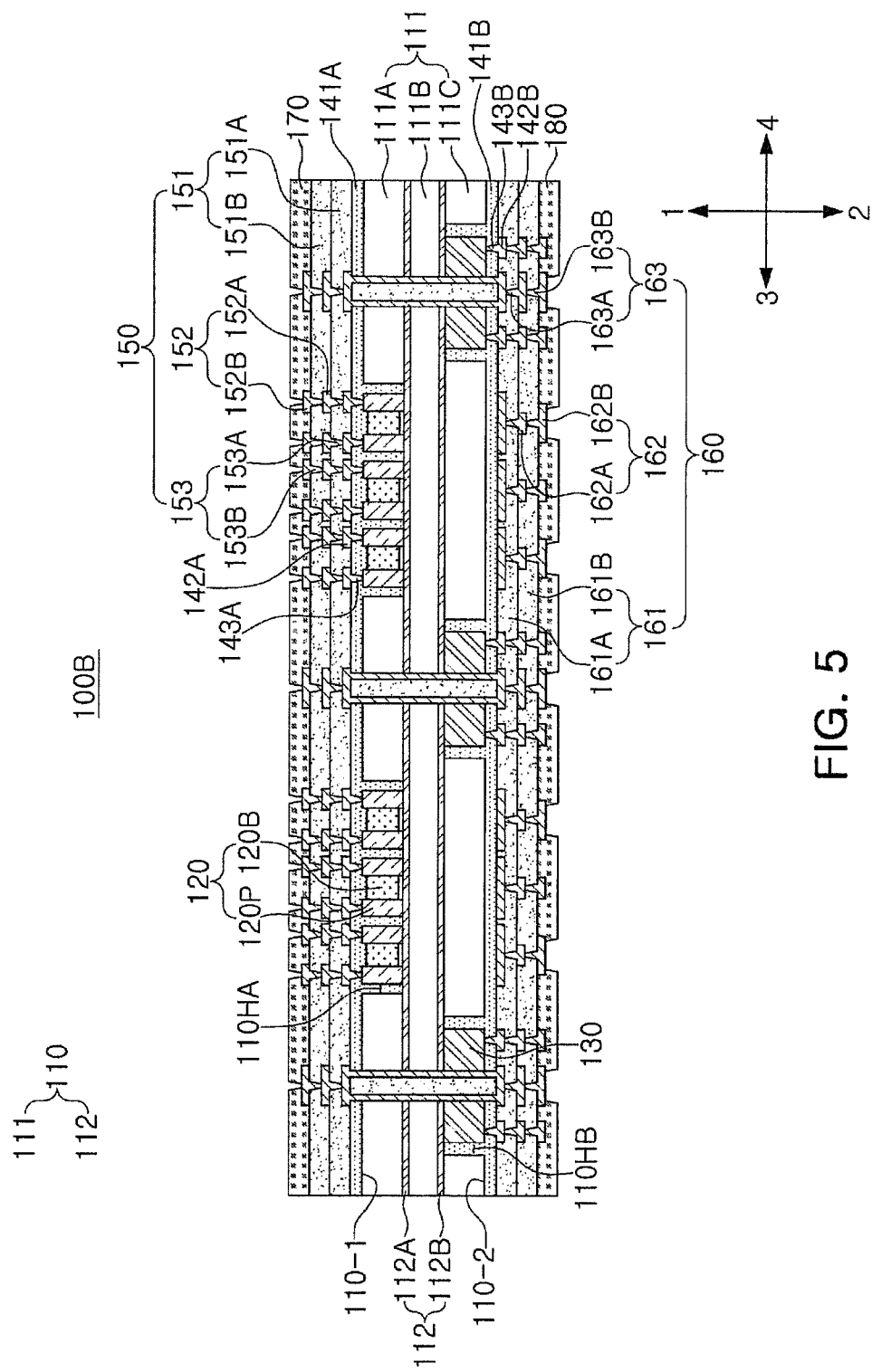
FIG. 5 is a cross-sectional view schematically illustrating an electronic component embedded substrate 100B according to another exemplary embodiment.

FIG. 5 is a cross-sectional view schematically illustrating an electronic component embedded substrate 100B according to another example.

In an electronic component embedded substrate 100B according to another example, a core layer 110 may include a plurality of insulating layers 111A, 111B, and 111C, and a plurality of resin layers 112A and 112B, stacked in the thickness direction of the core layer 110, compared to the electronic component embedded substrate 100A according to an exemplary embodiment. In this case, each of the plurality of insulation layers 111A, 111B, and 111C may be thicker than each of the plurality of resin layers 112A and 112B.

More specifically, the core layer 110 may be those in which the first insulation layer 111A, the first resin layer 112A, the second insulation layer 111B, the second resin layer 112B, and the third insulation layer 111C are stacked in a direction, from the first direction to the second direction. Therefore, the first resin layer 112A may be disposed between the first insulation layer 111A and the second insulation layer 111B, and the second resin layer 112B may be disposed between the second insulation layer 111B and the third insulation layer 111C.

The insulation layer 111A disposed on an outermost side in the third direction, among the plurality of insulation layers 111A, 111B, and 111C, may have a first cavity 110HA. The insulation layer 111C disposed on an outermost side in the fourth direction, among the plurality of insulation layers 111A, 111B, and 111C, may have a second cavity 110HB. When the third direction is an upward direction and the fourth direction is a downward direction, the insulation layer 111A disposed on an uppermost side, among the plurality of insulation layers 111A, 111B, and 111C, may have the first cavity 110HA. In addition, the insulation layer 111C disposed on a lowermost side, among the plurality of insulation layers 111A, 111B, and 111C, may have the second cavity 110HB.

The structure of the core layer 110 is not limited thereto, and the core layer 110 may be changed by those skilled in the art. For example, the number of insulation layers and/or resin layers included in the core layer 110 may be more or less than that illustrated in the drawings.

A material for forming each of the first insulation layer 111A, the second insulation layer 111B, and the third insulation layer 111C is not particularly limited, and any material may be used, as long as it has insulation properties. For example, a thermosetting resin such as an epoxy resin, a thermoplastic resin such as polyimide, or materials further including reinforcing materials such as inorganic fillers, and/or glass cloth, glass fabric, or the like, together therewith, such as prepreg, Ajinomoto Build-up Film (ABF), FR-4, bismaleimide triazine (BT), and the like may be used. As necessary, a photoimageable dielectric (PID) resin may be used.

The first resin layer 112A may bond the first insulation layer 111A and the second insulation layer 111B together, and the second resin layer 112B may bond the second insulation layer 111B and the third insulation layer 111C together by a pressurized heating press process. In the press process, the first resin layer 112A and the second resin layer 112B may be in a semi-cured state.

A material for forming each of the first resin layer 112A and the second resin layer 112B is not particularly limited, and any material may be used, as long as it has insulation properties. For example, a thermosetting resin such as an epoxy resin, a thermoplastic resin such as polyimide, or materials further including reinforcing materials such as inorganic fillers, and/or glass cloth, glass fabric, or the like, together therewith, such as prepreg, Ajinomoto Build-up Film (ABF), FR-4, bismaleimide triazine (BT), and the like may be used. As necessary, a photoimageable dielectric (PID) resin may be used.

Since the others may be substantially the same as those described in the electronic component embedded substrate 100A according to an exemplary embodiment, detailed descriptions thereof will be omitted.

Figure 6:
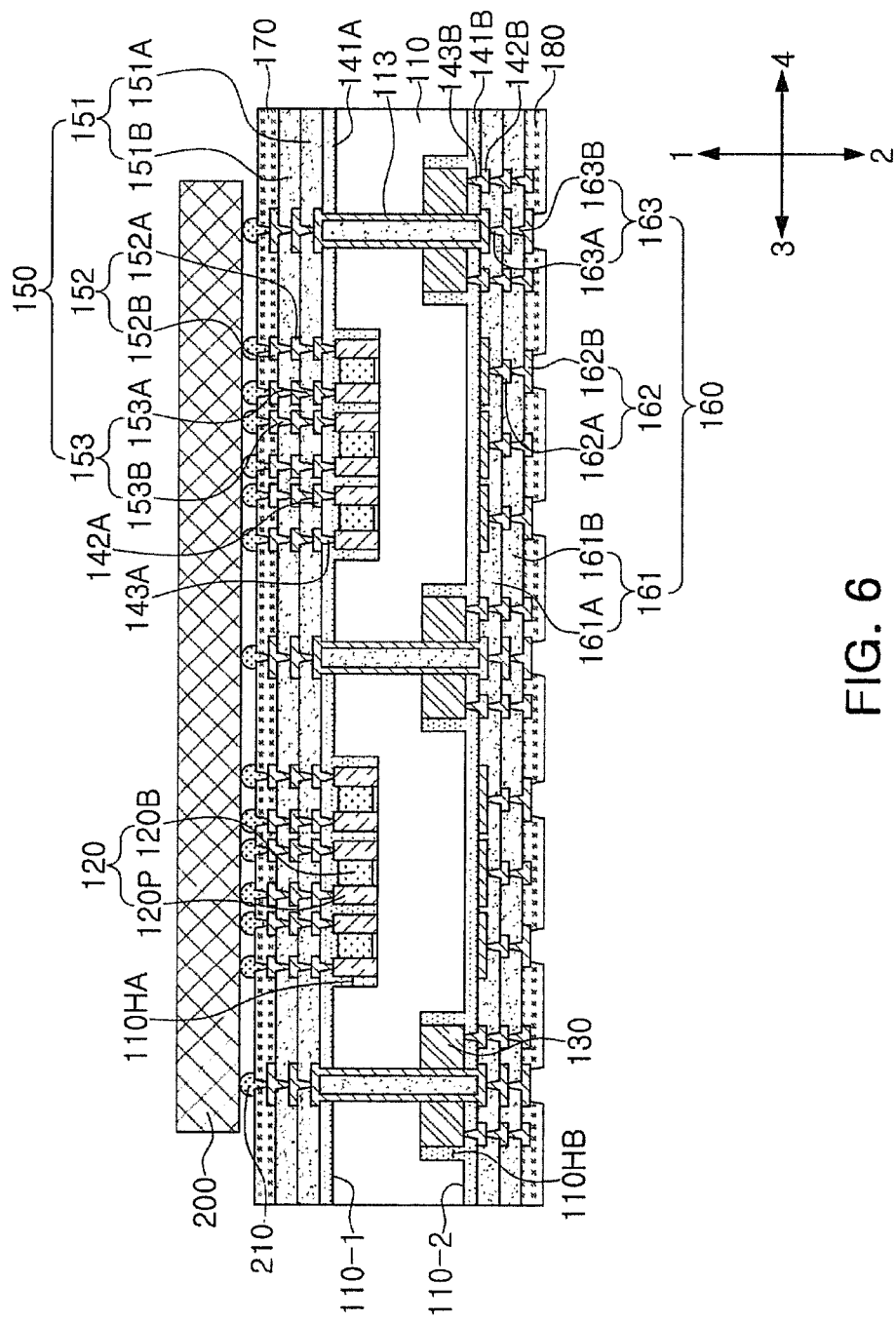
FIG. 6 is a cross-sectional view schematically illustrating a semiconductor package mounted on an electronic component embedded substrate 100A according to an exemplary embodiment.

FIG. 6 is a cross-sectional view schematically illustrating an example in which a semiconductor package is mounted on an electronic component embedded substrate 100A according to an exemplary embodiment.

Referring to the drawings, when the above-described electronic component embedded substrate 100A according to an exemplary embodiment of the present disclosure is used, the semiconductor package 200 may be mounted on the electronic component embedded substrate 100A through an electrical connection metal 210. In this case, the embedded electronic component 120 may be electrically connected to a semiconductor chip (not illustrated) included in the semiconductor package 200 by a relatively short electrical path.

The semiconductor package 200 may be a package in which the semiconductor chip (not illustrated) is mounted on a separate interposer substrate, but is not limited thereto.

The semiconductor chip (not illustrated) included in the semiconductor package 200 may be an application specific integrated circuit (ASIC) and/or a high bandwidth memory (HBM), but is not limited thereto.

The electrical connection metal 210 may include a low melting metal, for example, tin (Sn), or an alloy containing tin (Sn). More specifically, the electrical connection metal 210 may be formed of solder or the like, but is only illustrative and a material thereof is not particularly limited thereto.

In addition, the electrical connection metal 210 may be fixed with an under-fill resin, but is not limited thereto.

Meanwhile, the electronic component embedded substrate 100A may be mounted on a main board (not illustrated) through a separate electrical connection metal (not illustrated).

The term of "connect" or "connection" in the present specification may be not only a direct connection, but also a concept including an indirect connection through an adhesive layer or the like. In addition, the term "electrically connected" or "electrical connection" in the present specification is a concept including both a physical connection and a physical non-connection. Also, the expressions of "first," "second," etc. in the present specification are used to distinguish one component from another, and do not limit the order and/or importance of the components. In some cases, without departing from the spirit of the present disclosure, a "first" component may be referred to as a "second" component, and similarly, a "second" component may be referred to as a "first" component.

The expression "example" used in this specification does not refer to the same example to each other, but may be provided for emphasizing and explaining different unique features. However, the above-mentioned examples do not exclude that the above-mentioned examples are implemented in combination with the features of other examples. For example, although the description in a specific example is not described in another example, it can be understood as an explanation related to another example, unless otherwise described or contradicted by the other example.

The terms used in the present disclosure are used only to illustrate various examples and are not intended to limit the present inventive concept. Singular expressions include plural expressions unless the context clearly dictates otherwise.

As one effect of the present disclosure, an electronic component embedded substrate having improved heat dissipation characteristics may be provided.

As another effect among various effects of the present disclosure, an electronic component embedded substrate having improved warpage may be provided.

While examples have been illustrated and described above, it will be apparent to those skilled in the art that modifications and variations could be made without departing from the scope of the present disclosure as defined by the appended claims.

What is claimed is:

1. An electronic component embedded substrate comprising:
    a core layer having a first cavity and a second cavity on a first surface and a second surface of the core layer, respectively, the second surface opposite to the first surface in a thickness direction of the core layer;
    an electronic component disposed in the first cavity;
    a first insulating material covering at least a portion of the electronic component;
    a first wiring layer disposed on the first insulating material and connected to the electronic component;
    a built-in block disposed in the second cavity; and
    a second insulating material covering at least a portion of the built-in block,
    wherein the second insulating material covers at least a portion of an exposed surface of the built-in block in the thickness direction, and is disposed in a gap between the second cavity an the built-in block in a direction perpendicular to the thickness direction.

2. The electronic component embedded substrate according to claim 1, wherein the first cavity penetrates through a portion of the core layer from the first surface in the thickness direction, and the second cavity penetrating through a portion of the core layer from the second surface in the thickness direction.

3. The electronic component embedded substrate according to claim 1, wherein the electronic component and the built-in block are arranged to deviate from each other in a direction perpendicular to the thickness direction.

4. The electronic component embedded substrate according to claim 3, wherein the electronic component and the built-in block are arranged not to overlap each other in the direction perpendicular to the thickness direction.

5. The electronic component embedded substrate according to claim 1, wherein the core layer has a plurality of first cavities and a plurality of second cavities,
    one or more electronic components are disposed in each of the plurality of the first cavities, and
    one or more built-in blocks are disposed in each of the plurality of second cavities.

6. The electronic component embedded substrate according to claim 5, wherein the number of the one or more electronic components disposed in each of the plurality of first cavities is greater than the number of the one or more built-in blocks disposed in each of the plurality of second cavities.

7. The electronic component embedded substrate according to claim 1, wherein the built-in block comprises a thermally conductive material.

8. The electronic component embedded substrate according to claim 7, wherein the built-in block includes copper.

9. The electronic component embedded substrate according to claim 1, wherein the core layer comprises a plurality of insulation layers stacked in the thickness direction of the core layer,
    an uppermost insulation layer among the plurality of insulation layers has the first cavity, and
    a lowermost insulation layer among the plurality of insulation layers has the second cavity.

10. The electronic component embedded substrate according to claim 9, wherein the core layer further comprises one or more resin layers each disposed between adjacent insulation layers of the plurality of insulation layers.

11. The electronic component embedded substrate according to claim 10, wherein each of the plurality of insulation layers is thicker than each of the one or more resin layers.

12. The electronic component embedded substrate according to claim 1, wherein the electronic component includes a chip type passive component having an electrode.

13. The electronic component embedded substrate according to claim 1, further comprising a via penetrating through the first insulating material and connecting the electronic component and the first wiring layer to each other.

14. An electronic component embedded substrate, comprising the electronic component embedded substrate according to claim 1 and a semiconductor package mounted on the electronic component embedded substrate through at least one electrical connection metal which electrically connects the semiconductor package to the electronic component embedded substrate.

15. The electronic component embedded substrate according to claim 1, wherein the built-in block is in a form of a lump.

16. An electronic component embedded substrate comprising:
    a core layer having a first cavity and a second cavity on a first surface and a second surface of the core layer, respectively, the second surface opposite to the first surface in a thickness direction of the core layer;

an electronic component disposed in the first cavity;
a first insulating material covering at least a portion of the electronic component;
a first wiring layer disposed on the first insulating material and connected to the electronic component;
a built-in block, which is in a form of a lump, disposed in the second cavity;
a second insulating material covering at least a portion of the built-in block;
a second wiring layer disposed on the second insulating material; and
a through-via penetrating through the core layer and the built-in block and connecting the first wiring layer and the second wiring layer to each other.

17. The electronic component embedded substrate according to claim 16, further comprising a via penetrating through the second insulating material and connecting the built-in block and the second wiring layer to each other.

18. The electronic component embedded substrate according to claim 17, further comprising:
a first build-up structure disposed on the first insulating material and including a third wiring layer connected to the first wiring layer; and
a second build-up structure disposed on the second insulating material and including a fourth wiring layer connected to the second wiring layer.

19. An electronic component embedded substrate comprising:
a first build-up structure including a first wiring layer;
one or more electronic components disposed in the first build-up structure and connected to the first wiring layer;
a second build-up structure including a second wiring layer and disposed on the first build-up structure;
one or more built-in blocks, each of which is in a form of a lump, disposed in the second build-up structure;
an insulating layer arranged between the one or more electronic components of the first build-up structure and the one or more built-in blocks of the second build-up structure; and
a through-via penetrating through the insulating layer and the built-in block and connecting the first wiring layer and second wiring layer to each other.

20. The electronic component embedded substrate according to claim 19, further comprising:
a first resin layer arranged between the insulating layer and the one or more electronic components; and
a second resin layer arranged between the insulating layer and the one or more built-in blocks.

* * * * *